United States Patent
Foca et al.

(10) Patent No.: US 12,293,895 B2
(45) Date of Patent: May 6, 2025

(54) CHARGED PARTICLE BEAM SYSTEM, METHOD OF OPERATING A CHARGED PARTICLE BEAM SYSTEM, METHOD OF RECORDING A PLURALITY OF IMAGES AND COMPUTER PROGRAMS FOR EXECUTING THE METHODS

(71) Applicant: Carl Zeiss SMT GmbH, Oberkochen (DE)

(72) Inventors: Eugen Foca, Ellwangen (DE); Amir Avishai, Pleasanton, CA (US); Thomas Korb, Schwäbisch Gmünd (DE); Daniel Fischer, Dresden (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 18/379,400

(22) Filed: Oct. 12, 2023

(65) Prior Publication Data
US 2024/0038482 A1    Feb. 1, 2024

Related U.S. Application Data

(62) Division of application No. 17/542,773, filed on Dec. 6, 2021, now Pat. No. 11,810,749.

(51) Int. Cl.
*H01J 37/147*    (2006.01)
*H01J 37/10*    (2006.01)
(Continued)

(52) U.S. Cl.
CPC .......... *H01J 37/1474* (2013.01); *H01J 37/10* (2013.01); *H01J 37/265* (2013.01); *H01J 37/28* (2013.01)

(58) Field of Classification Search
CPC ........ H01J 37/00; H01J 37/02; H01J 37/1474; H01J 37/10; H01J 37/26; H01J 37/265;
(Continued)

(56) References Cited

U.S. PATENT DOCUMENTS 5,665,968 A * 9/1997 Meisburger ......... H01J 37/3005
250/306
5,945,667 A * 8/1999 Bohnert ................. G01L 9/085
324/96

(Continued)

FOREIGN PATENT DOCUMENTS

DE   102020114774   9/2021
WO   WO 2021/165135   8/2021  ............. H01J 37/28

OTHER PUBLICATIONS

The Office Action issued by the Korean Patent Office for Application No. KR 10-2022-0163698 dated Nov. 20, 2024 (with English Translation).

*Primary Examiner* — Jason L McCormack
(74) *Attorney, Agent, or Firm* — Fish & Richardson P.C.

(57) ABSTRACT

The present invention relates to a charged particle beam system comprising a deflection subsystem configured to deflect a charged particle beam in a deflection direction based on a sum of analog signals generated by separate digital to analog conversion of a first digital signal and a second digital signal. The present invention further relates to a method of configuring the charged particle beam system so that each of a plurality of regions of interest can be scanned by varying only the first digital signal while the second digital signal is held constant at a value associated with the respective region of interest. The present invention further relates to a method of recording a plurality of images of the regions of interest at the premise of reduced interference due to charge accumulation.

21 Claims, 6 Drawing Sheets

(51) Int. Cl.
*H01J 37/26* (2006.01)
*H01J 37/28* (2006.01)

(58) Field of Classification Search
CPC ...... H01J 37/28; H01J 37/147; H01J 37/1472; H01J 37/21; H01J 37/222; H01J 2237/1504; H03M 1/1245
USPC .............................. 250/396 R, 306, 307, 311
See application file for complete search history.

(56) References Cited

U.S. PATENT DOCUMENTS

| | | | |
|---|---|---|---|
| 5,945,677 A * | 8/1999 | Leung | H01J 37/3177 250/398 |
| 6,774,379 B2 | 8/2004 | Hashimoto | |
| 7,898,447 B2 * | 3/2011 | Goshima | G03F 1/78 341/120 |
| 2005/0012049 A1 | 1/2005 | Bierhoff et al. | |
| 2009/0114839 A1 | 5/2009 | LeChavalier | |
| 2014/0203185 A1 | 7/2014 | Nakayama et al. | |
| 2015/0041643 A1 | 2/2015 | Li et al. | |
| 2017/0263843 A1 | 9/2017 | Kempter et al. | |
| 2019/0157063 A1 | 5/2019 | Jaeschke et al. | |
| 2019/0189389 A1 | 6/2019 | Uemura et al. | |
| 2019/0360951 A1 * | 11/2019 | Ogawa | G01N 23/04 |
| 2023/0037773 A1 | 2/2023 | Principe et al. | |
| 2023/0178327 A1 | 6/2023 | Foca et al. | |

* cited by examiner

CHARGED PARTICLE BEAM SYSTEM, METHOD OF OPERATING A CHARGED PARTICLE BEAM SYSTEM, METHOD OF RECORDING A PLURALITY OF IMAGES AND COMPUTER PROGRAMS FOR EXECUTING THE METHODS

CROSS-REFERENCE TO RELATED APPLICATION

This application is a divisional of and claims priority under 35 U.S.C. § 120 to U.S. application Ser. No. 17/542,773, filed on Dec. 6, 2021, the entire content of which is incorporated herein by reference.

TECHNICAL FIELD

The present invention relates to a charged particle beam system and a method of operating a charged particle beam system. In particular the present invention relates to a deflection system for deflecting a charged particle beam, a method of configuring the deflection system and using the charged particle beam system to record a plurality of images of remote regions of interest; and a computer program configuring a controller of a charged particle beam system to execute the method.

Further, the present invention relates to a method of recording a plurality of images of different regions of interest; and a computer program configuring a controller of a charged particle beam system to execute the method.

BACKGROUND

A conventional charged particle beam system comprises a charged particle beam source configured to generate a charged particle beam, an objective lens configured to focus the charged particle beam into a focal plane, and a deflection system configured to deflect the charged particle beam. The conventional deflection system comprises a counter, a DAC (digital-to-analog converter), an analog amplifier and a field generator. The counter generates a digital output value incremented at a controlled rate. The DAC converts the digital output value output by the counter into an analog signal. The analog amplifier amplifies the analog signal output by the DAC and applies the amplified analog signal to the field generator. The field generator uses the amplified analog signal to generate a magnetic and/or electric field for deflecting the charged particle beam.

A field of application of a charged particle beam system is inspection of wafers. Wafers are large compared to the field of view of the charged particle beam system limited by the deflection system. In order to image remote regions of interest on the wafer, the field of view of the charged particle beam system must be large and/or a stage holding the wafer must be moved. According to the conventional deflection system, under the assumption of constant bit depth for the DAC, a large field of field can be configured by selecting a large amplification at the cost of reduced spatial sampling frequency of the resulting image because field of view and maximum spatial sampling frequency are inversely interrelated for a constant bit depth of the DAC. Moving the stage generally slows down the acquisition rate of images and introduces errors due to stage drift. Therefore, the conventional charged particle beam system lacks capability of imaging remote regions of interest at high spatial sampling frequency and high accuracy.

Another commonly known problem of recording of images using a charged particle beam system is charge accumulation in the sample due to impinging charged particles of the charged particle beam. This problem can be severe for samples having low electric conductivity. The charge accumulation can generate an unpredictable electric field which affects the impinging charged particle beam, resulting in beam deflection and beam shift and generally in a worse image.

SUMMARY

A feature of the present invention is to provide a charged particle beam system and a method of operating a charged particle beam system for imaging remote regions of interest at high spatial sampling frequency and high accuracy.

The feature is achieved by the subject matter of the independent claims. Preferred embodiments are defined in the dependent claims.

According to a first aspect of the present invention, a charged particle beam system comprises a charged particle beam source configured to generate a charged particle beam; an objective lens configured to focus the charged particle beam into a focal plane; a deflection system configured to deflect the charged particle beam; and a controller. The deflection system comprises at least one deflection subsystem. Each deflection subsystem is configured to deflect the charged particle beam along a deflection direction. Multiple deflection subsystems are configured to deflect the charged particle beam along different deflection directions. Each deflection direction is generally essentially perpendicular to an optical axis of the charged particle beam system.

Each deflection subsystem comprises a first DAC circuit configured to convert a first digital deflection signal into a first analog output signal within a first operating range at steps of a first step height, a second DAC circuit configured to convert a second digital deflection signal into a second analog output signal within a second operating range at steps of a second step height, a summer configured to receive the first analog output signal and the second analog output signal and to output an analog deflection signal based ci on the sum of the received first analog output signal and the received second analog output signal; and a field generator configured to receive the analog deflection signal and to generate a magnetic and/or electric field for deflecting the charged particle beam using the received analog deflection signal.

The controller is configured to generate the first digital deflection signal and the second digital deflection signal separately for each deflection subsystem.

A sample can be located in the focal plane of the objective lens for observing, analyzing or manipulating the sample.

According to a second aspect of the present invention, a method of operating the charged particle beam system comprises: obtaining coordinates of a plurality of regions of interest on a sample; configuring the first DAC circuit so that a first scanning range provided by the first DAC circuit is at least as large as the largest of the regions of interest, the first scanning range representing a length of a region in a focal plane of the objective lens scannable by varying the first digital deflection signal while maintaining the second digital deflection signal; configuring the second DAC circuit so that a second scanning range provided by the second DAC circuit is at least as large as the largest distance between the regions of interest, the second scanning range representing a length of a region in the focal plane scannable by varying the second digital deflection signal while maintaining the first digital deflection signal; and recording images of the regions of interest using the configurations made.

The two DAC circuits of each deflection subsystem can be configured and set individually, for example so that the first DAC circuit provides a highly accurate small contribution to the analog deflection signal whereas the second DAC circuit provides a moderately accurate large contribution to the analog deflection signal. This configuration allows for accurate scanning at high spatial sampling frequency (i.e., adjacent dwell locations of the charged particle beam on the sample are close to each other) within a scanning range provided by the first DAC circuit and for a large field of view provided by a scanning range provided by the second DAC circuit.

A third aspect of the present invention relates to a method of recording a plurality of images representing different regions of interest of a sample. The method comprises recording a plurality of images representing a plurality of different regions of interest on a sample. The recording of the plurality of images comprises scanning a charged particle beam over a plurality of scan regions, wherein each of the regions of interest comprises a plurality of the scan regions, wherein each two scan regions to be scanned in succession are separated by at least a first minimum distance amounting to at least 100 nm, and wherein each two scan regions to be scanned in succession belong to different ones of the regions of interest.

According to this method, each of the images is recorded by recording a plurality of segments of the respective image one after another. Each of the segments corresponds to one scan region. Between consecutive recordings of two segments of a same image by scanning the charged particle beam over the scan regions corresponding to the two segments, a segment of another image is recorded by scanning the charged particle beam over a scan region corresponding to that segment. That is, the recording of two different segments of the same image is interlaced by the recording of a segment of another image.

In order to reduce the effects of charge accumulation due to the scanning of the charged particle beam over the sample, each two scan regions to be scanned in succession are separated by at least a first minimum distance amounting to at least 100 nm. Therefore, charge accumulated at a first scan region due to the scanning of the charged particle beam over the first scan region has little effect on the scanning of a second scan region to be scanned in succession to the first scan region, because the second scan region is far away from the first scan region. During the scanning of the second scan region, the charge accumulated at the first scan region can distribute in the sample or be dissipated. Therefore, a third scan region to be scanned in succession to the second scan region can be located in proximity of the first scan region, and the scanning of the first scan region has little effect on the scanning of the third scan region because the charge accumulated at the first scan region is distributed or dissipated at that time.

Therefore, the method allows to record, using a charged particle beam, a plurality of images with reduced interference of charge accumulation caused by directing the charged particle beam to the sample.

A fourth aspect of the invention relates to a computer program comprising instructions which, when executed by a controller of a charged particle beam system, enable the charged particle beam system to execute any of the methods described herein. The methods described herein can be performed using the charged particle beam systems described herein.

BRIEF DESCRIPTION OF DRAWINGS

Hereinafter, embodiments of the invention are described with reference to the accompanying drawings.

DETAILED DESCRIPTION

Figure 1:
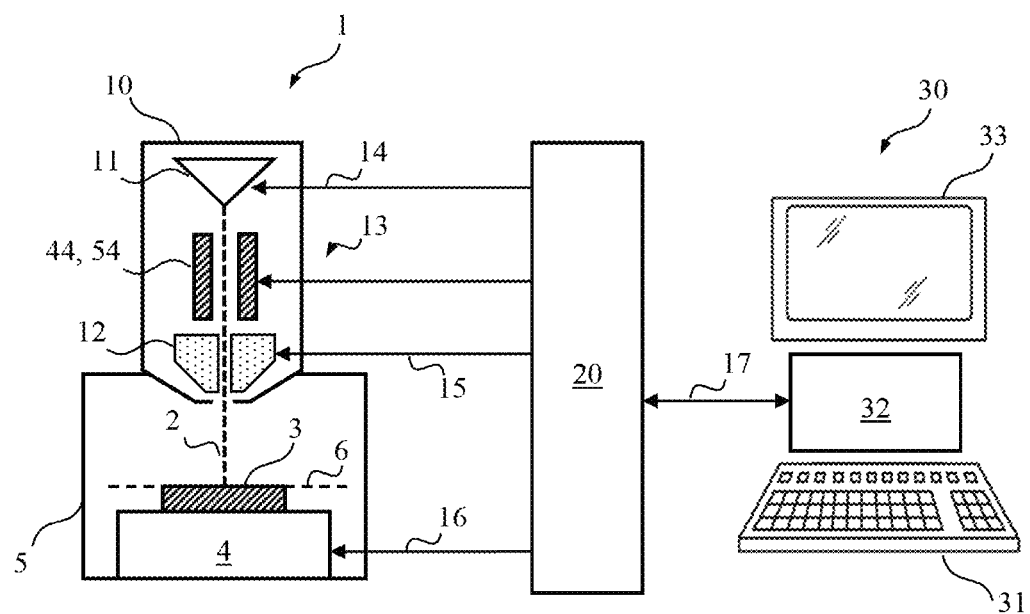
FIG. 1 schematically illustrates a charged particle beam system according to an embodiment of the first aspect of the invention.

Referring to FIG. 1, a charged particle beam system 1 according to the first aspect of the invention is described. The charged particle beam system 1 comprises a charged particle beam column 10, a controller 20 and a user interface 30. The user interface 30 is used to configure the controller 20. The controller 20 is configured to control the charged particle beam column 10. The charged particle beam system 1 can be an electron beam microscope, for example.

The charged particle beam column 10 comprises a charged particle beam source 11, an objective lens 12 and a deflection system 13. Depending on the type of the charged particle beam system, the charged particle beam column 10 can comprise further elements such as condensers, stigmators, detectors and the like. However, for simplicities' sake, such further elements are neither illustrated nor described in more detail.

The charged particle beam source 11 is configured to generate a charged particle beam 2. The charged particle beam 2 can be a beam of electrons or ions, for example. The charged particle beam source 11 is controlled by the controller 20 as indicated by a connection line 14.

The objective lens 12 is configured to focus the charged particle beam 2 onto a focal plane 6. In the present example, a sample 3 is positioned in the focal plane 6. The objective lens 12 can be a magnetic lens comprising coils configured to generate a magnetic field for focusing the charged particle beam 2. The objective lens 12 can be an electric lens comprising electrodes configured to generate an electric field for focusing the charged particle beam 2. The objective lens 12 is controlled by the controller 20 as indicated by a connection line 15.

The deflection system 13 is configured to deflect the charged particle beam 2 in at least one deflection direction. Deflecting the charged particle beam 2 means changing the propagation direction of the charged particle beam 2. The deflection system 13 is described in more detail with reference to FIG. 2.

The charged particle beam system 1 further comprises a stage 4 configured to position and orientate the sample 3. The stage 4 is controlled by the controller 20 as indicated by a connection line 16.

The charged particle beam system 1 further comprises a vacuum chamber 5 accommodating the stage 4 and the sample 3 when held by the stage 4. The charged particle beam column 10 is connected to the vacuum chamber 5 so that the charged particle beam 2 is incident onto the sample 3 held on the stage 4.

The controller 20 is configured to control the charged particle beam column 10, in particular its components, and the stage 4. The controller 20 is connected to the user interface 30 by, a connection line 17.

The user interface 30 can be used to define and manipulate parameters used by the controller 20 for controlling. For example, the user interface 30 can comprise an input device 31 (such as a mouse or keyboard) for receiving inputs of a user, a processing unit 32 for processing the received inputs, and an output device 33 (such as a display) for outputting information to the user. The processing unit 32 is connected to the controller by the connection line 17. The processing unit 32 can transmit data to the controller 20 for configuring the controller 20 and can receive data from the controller 20 (such as measurement data, configuration data, etc.).

The deflection system 13 is configured to deflect the charged particle beam 2 so that the charged particle beam 2 can be directed to a plurality of different locations in the focal plane 6, thereby directing the charged particle beam 2 to a plurality of different locations on a surface of the sample 3. Directing the charged particle beam 2 to a plurality of different locations in the focal plane 6 by deflecting the charged particle beam 2 can also be referred to as scanning.

Figure 2:
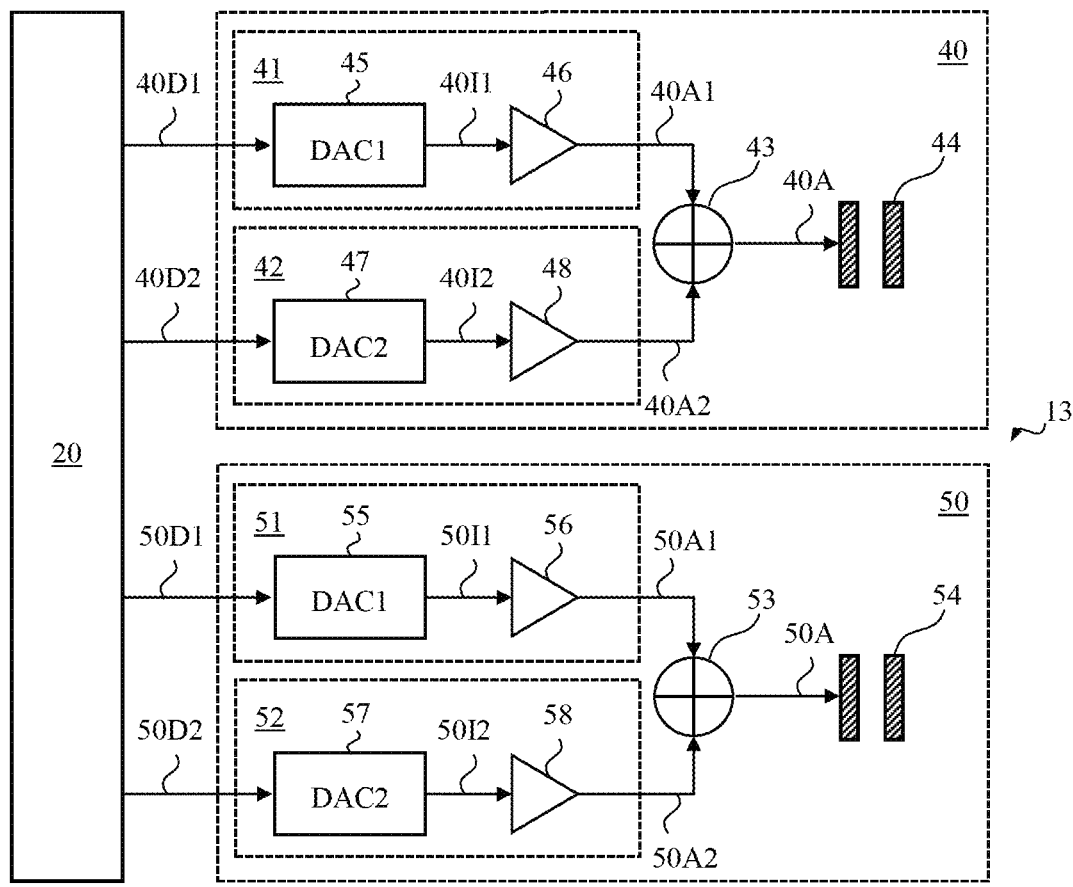
FIG. 2 schematically illustrates a deflection system of the charged particle beam system.

Referring to FIG. 2, the deflection system 13 is described in more detail. The deflection system 13 comprises at least one deflection subsystem. In the example illustrated in FIG. 2, the deflection system 13 comprises two deflection subsystems 40 and 50. The deflection subsystem 40 is configured to deflect the charged particle beam along a first deflection direction; the deflection subsystem 50 is configured to deflect the charged particle beam 2 along a second deflection direction. The first deflection direction and the second deflection direction are different directions which are essentially perpendicular to an optical axis of the charged particle beam system 1 (for example, an optical axis of the objective lens 12). The deflection subsystems 40 and 50 have the same principal configuration, but can be set and controlled individually.

The deflection subsystem 40 comprises a first DAC circuit 41 configured to convert a first digital deflection signal 40D1 into a first analog output signal 40A1 within a first operating range OR1 at steps of a first step height SH1. The first operating range OR1 represents a range of the first analog output signal 40A1 generatable (i.e., that can be generated) by the first DAC circuit 41 using a predefined setting. The first step height SH1 represents the smallest difference between first analog output signals 40A1 generatable (i.e., that can be generated) by the first DAC circuit 41 using the predefined setting. Details of the digital-to-analog conversion of the first DAC circuit 41 are described with reference to FIG. 3.

The deflection subsystem 40 further comprises a second DAC circuit 42 configured to convert a second digital deflection signal 40D2 into a second analog output signal 40A2 within a second operating range OR2 at steps of a second step height SH2. The second operating range OR2 represents a range of the second analog output signal gen- eratable by the second DAC circuit 42 using a predefined setting. The second step height SH2 represents the smallest difference between second analog output signals generatable by the second DAC circuit 42 using the predefined setting. Details of the digital-to-analog conversion of the second DAC circuit 42 are described with reference to FIG. 3.

The first operating range OR1 and the second operating range OR2 are generally different from each other. The first step height SH1 and the second step height SH2 are generally different from each other.

The deflection subsystem 40 further comprises a summer 43 configured to receive the first analog output signal 40A1 and the second analog output signal 40A2 and to output an analog deflection signal 40A based on the sum of the received first analog output signal 40A1 and the received second analog output signal 40A2. For example, the summer can be a summing amplifier. The summer can also be referred to as an adder. For example, the summer 43 calculates the sum of the received first analog output signal and the received second analog output signal 40A2 and outputs the calculated sum as the analog deflection signal 40A. Alternatively, the calculated sum can be amplified by an additional amplifier, and the amplified calculated sum can be output as the analog deflection signal 40A.

The deflection subsystem 40 further comprises a field generator 44 configured to receive the analog deflection signal 40A and to generate a magnetic and/or electric field for deflecting the charged particle beam 2 using the received analog deflection signal 40A. The field generator 44 can comprise a coil configured to generate a magnetic field apt to deflect the charged particle beam 2. The field generator 44 can comprise electrodes configured to generate an electric field apt to deflect the charged particle beam 2. The received analog deflection signal 40A is used to energize the field generator 44.

The controller 20 determines the first digital deflection signal 40D1 and the second digital deflection signal 40D2 and inputs the first digital deflection signal 40D1 into the first DAC circuit 41 and inputs the second digital deflection signal 40D2 into the second DAC circuit 42.

In particular, as illustrated in FIG. 2, the first DAC circuit 41 can comprise a first DAC 45 configured to convert the first digital deflection signal 40D1 into a first analog intermediate signal 40I1 and a first amplifier 46 configured to generate the first analog output signal 40A1 by amplifying the first analog intermediate signal 40I1 with a first amplification. Similarly, the second DAC circuit 42 can comprise a second DAC 47 configured to convert the second digital deflection signal 40D2 into a second analog intermediate signal 40I2 and a second amplifier 48 configured to generate the second analog output signal 40A2 by amplifying the second analog intermediate signal 40I2 with a second amplification. The predefined setting of the first DAC circuit 41 can be defined by a bit depth of the first DAC 45 and the first amplification. The predefined setting of the second DAC circuit 42 can be defined by a bit depth of the second DAC: 47 and the second amplification. In general, the bit depths and the amplifications can be different from each other. More details of the functionality of the first DAC circuit 41 and the second DAC circuit 42 are described with reference to FIG. 3.

Figure 3:
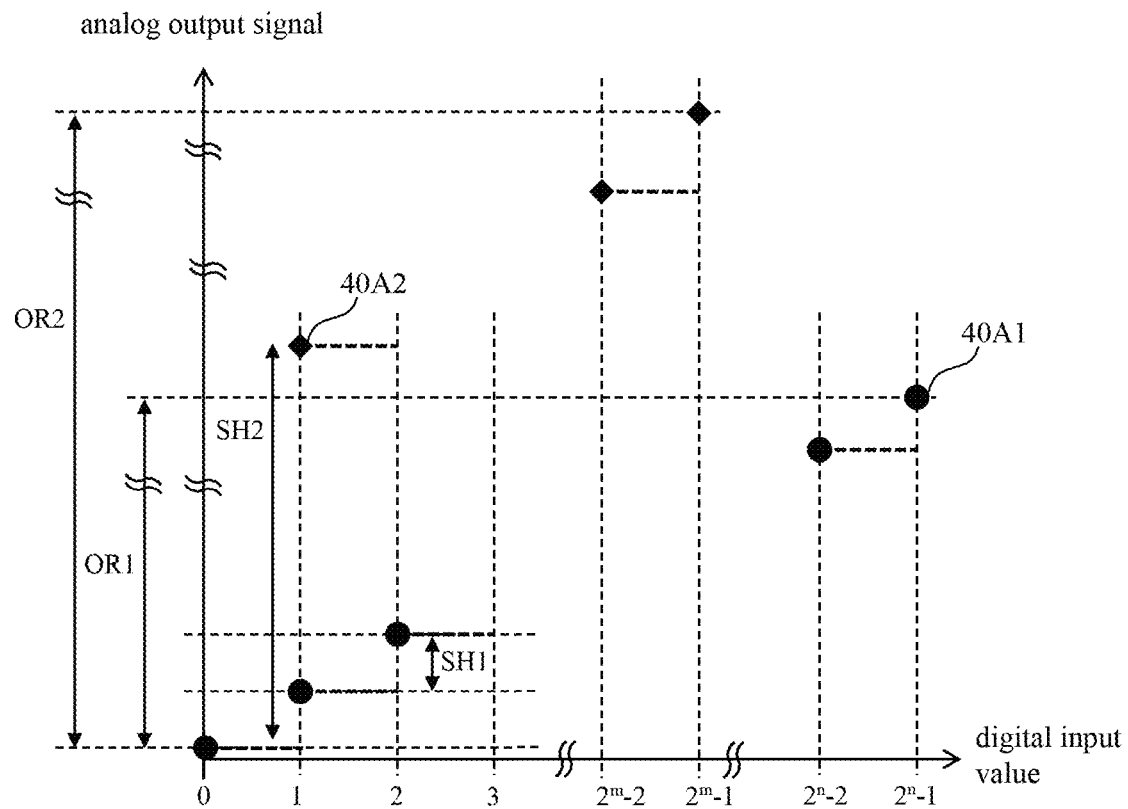
FIG. 3 schematically illustrates digital-to-analog conversions of DAC circuits of the deflection subsystem.

FIG. 3 illustrates a diagram representing a digital-to-analog conversion behavior of the first DAC circuit 41 and the second DAC circuit 42. The horizontal axis of the diagram represents a digital input value inputted to the first DAC circuit 41 (i.e., potential values of the first digital deflection signal 40D1) and a digital input value inputted to the second DAC circuit 42 (i.e., potential values of the second digital deflection signal 40D2). In the present example, it is assumed that the first DAC circuit 41 (the first DAC has a bit depth of n and that the second DAC circuit 42 (the second. DAC 47) has a bit depth of m, wherein m and n are integers and n is greater than m. However, alternatively, the bit depths m and n can also be the same or m can be greater than n. The bit depth of a DAC circuit (a DAC) defines the number of bits of the digital input value which is converted into an analog output signal by the DAC circuit (the DAC). In this case, the first DAC circuit 41 (the first DAC 45) and the second DAC circuit 42 (the second DAC 47) have different bit depths. However, this is merely an example and the first DAC circuit 41 (the first DAC 45) and the second. DAC circuit 42 (the second DAC 47) can have the same bit depth. For saving costs, the second DAC circuit 42 (the second DAC 47) can have a lower bit depth than the first DAC circuit 41 (the first DAC 45). For example, the first. DAC circuit 41 (the first. DAC 45) can have a bit depth of and the second DAC circuit 42 (the second DAC 47) can have a bit depth of 8.

The vertical axis of the diagram represents an analog output signal generated based on the digital input value. In particular, the first analog output signal 40A1 generated by the first DAC circuit 41 is illustrated using circular points; and the second analog output signal 40A2 generated by the second DAC circuit 42 is illustrated using diamond points. Although not distinguishably illustrated in FIG. 3, an input of zero is converted to an output of zero by both the first DAC circuit 41 and the second DAC: circuit 42.

The first step height SH1 represents the smallest difference between first analog output signals 40A1 generatable by the first DAC circuit 41. I.e., the first step height SH1 represents the difference between the first analog output signals 40A1 generated by the first DAC circuit 41 based on a digital input value and that value incremented by 1. In particular, the first step height SH1 can be set by the first amplification of the first amplifier 46.

The second step height SH2 represents the smallest difference between second analog output signals 40A2 generatable by the second DAC circuit 42. I.e., the second step height SH2 represents the difference between the second analog output signals 40A2 generated by the second DAC circuit 42 based on a digital input value and that value incremented by 1. In particular, the second step height SH2 can be set by the second amplification of the second amplifier 48.

The first operating range OR1 represents a range of the first analog output signal generatable by the first DAC circuit 41. I.e., the first operating range OR1 is the difference between the first analog output signals 40A1 generated by the first DAC circuit 41 based on the largest digital input value ($2^n-1$) and the smallest digital input value (0). In particular, the first operating range OR1 is defined by the bit depth of the first DAC 45 ($n$) and the first amplification of the first amplifier 46.

The second operating range OR2 represents a range of the second analog output signal 40A2 generatable by the second DAC circuit 42. I.e., the second operating range is the difference between the second analog output signals 40A2 generated by the second DAC circuit 42 based on the largest digital input value ($2^m-1$) and the smallest digital input value (0). In particular, the second operating range OR2 is defined by the bit depth of the second DAC 47 ($m$) and the second amplification of the second amplifier 48.

An accuracy of converting the first digital deflection signal 40D1 into the first analog output signal 40A1 achieved by the first DAC circuit 41 can be defined based on a difference between a real first analog output signal 40A1 and an ideal first analog output signal, wherein the better accuracy is obtained by the smaller difference. For example, an ideal behavior of the first DAC circuit 41 could be to output ideal equidistant steps as an output signal. However, in practice, the real behavior of the first DAC circuit 41 shows a deviation from the ideal behavior resulting in approximately equidistant steps as the output signal.

An accuracy of converting the second digital deflection signal 40D2 into the second analog output signal 40A2 achieved by the second DAC circuit 42 can be defined based on a difference between a real second analog output signal 40A2 and an ideal second analog output signal, wherein the better accuracy is obtained by the smaller difference. For example, an ideal behavior of the second DAC circuit 42 could be to output ideal equidistant steps as an output signal. However, in practice, the real behavior of the second DAC circuit 42 shows a deviation from the ideal behavior resulting in approximately equidistant steps as the output signal.

The accuracy of converting the first digital deflection signal 40D1 into the first analog output signal 40A1 achieved by the first DAC circuit 41 can be greater than the accuracy of converting the second digital deflection signal 40D2 into the second analog output signal 40A2 achieved by the second DAC: circuit 42. That is, requirements regarding the accuracy of the second DAC circuit 42 can be less strict than requirements regarding the accuracy of the first DAC circuit 41.

An accuracy of converting the first digital deflection signal 40D1 into the first analog intermediate signal 40I1 achieved by the first DAC 45 can be defined based on a difference between a real first analog intermediate signal 40I1 and an ideal first analog intermediate signal, wherein the better accuracy is obtained by the smaller difference. For example, an ideal behavior of the first DAC 45 could be to output ideal equidistant steps as an output signal. However, in practice, the real behavior of the first DAC 45 shows a deviation from the ideal behavior resulting in approximately equidistant steps as the output signal.

An accuracy of converting the second digital deflection signal 40D2 into the second analog intermediate signal 40I2 achieved by the second DAC 47 can be defined based on a difference between a real second analog intermediate signal 40I2 and an ideal second analog intermediate signal, wherein the better accuracy is obtained by the smaller difference. For example, an ideal behavior of the second DAC 47 could be to output ideal equidistant steps as an output signal. However, in practice, the real behavior of the second DAC 47 shows a deviation from the ideal behavior resulting in approximately equidistant steps as the output signal.

The accuracy of converting the first digital deflection signal 40D1 into the first analog intermediate signal 40I1 achieved by the first DAC 45 can be greater than the accuracy of converting the second digital deflection signal 40D2 into the second analog intermediate signal 40I2 achieved by the second DAC 47. That is, requirements regarding the accuracy of the second DAC 47 can be less strict than requirements regarding the accuracy of the first DAC 45.

The first DAC circuit 41 and the second DAC circuit 42 both contribute to the analog output signal 40A provided to the field generator 44 and the resulting deflection of the charged particle beam 2. As illustrated in FIG. 3, the first DAC circuit 41 and the second DAC circuit 42 can be configured and set so that the contribution of the first analog output signal 40A1 to the analog output signal 40A is small but precise whereas the contribution of the second analog output signal 40A2 to the analog output signal 40A is large and not necessarily as precise as that of the first analog output signal 40A1. Such a configuration can be obtained by configuring the first DAC circuit 41 to have a high bit depth (e.g., 12 bits) and by setting the first amplification smaller than the second amplification.

As illustrated in FIG. 3, the first DAC circuit 41 and the second DAC circuit 42 can be configured and set so that the first operating range OR1 is approximately equal to the second step height SH2. In particular, the first amplification and the second amplification can be selected so that the first operating range OR1 is approximately equal to the second step height SH2. Other settings are possible. For example, the first DAC circuit 41 and the second DAC circuit 42 can be configured and set so that the first operating range OR1 is at least half of the second step height SH2.

According to another example, the first DAC circuit 41 and the second DAC circuit 42 can be configured and set so that a ratio of the second operating range OR2 to the first operating range OR1 amounts to at least 10, in particular at least 100, more in particular at least 200. In particular, the first amplification and the second amplification can be selected so that the ratio of the second operating range OR2 to the first operating range OR1 amounts to at least 10, in particular at least 100, more in particular at least 200.

The advantage of such a configuration and setting is that the first DAC circuit 41 can be used to generate a high precision component of the analog output signal 40A which is used to record high resolution images at high precision while a low precision component of the analog output signal 40A generated by the second. DAC circuit 42 is maintained (i.e., kept constant). On the other hand, a large field of view is obtained from the low precision component of the analog output signal 40A generated by the second DAC circuit 42.

Figure 4:
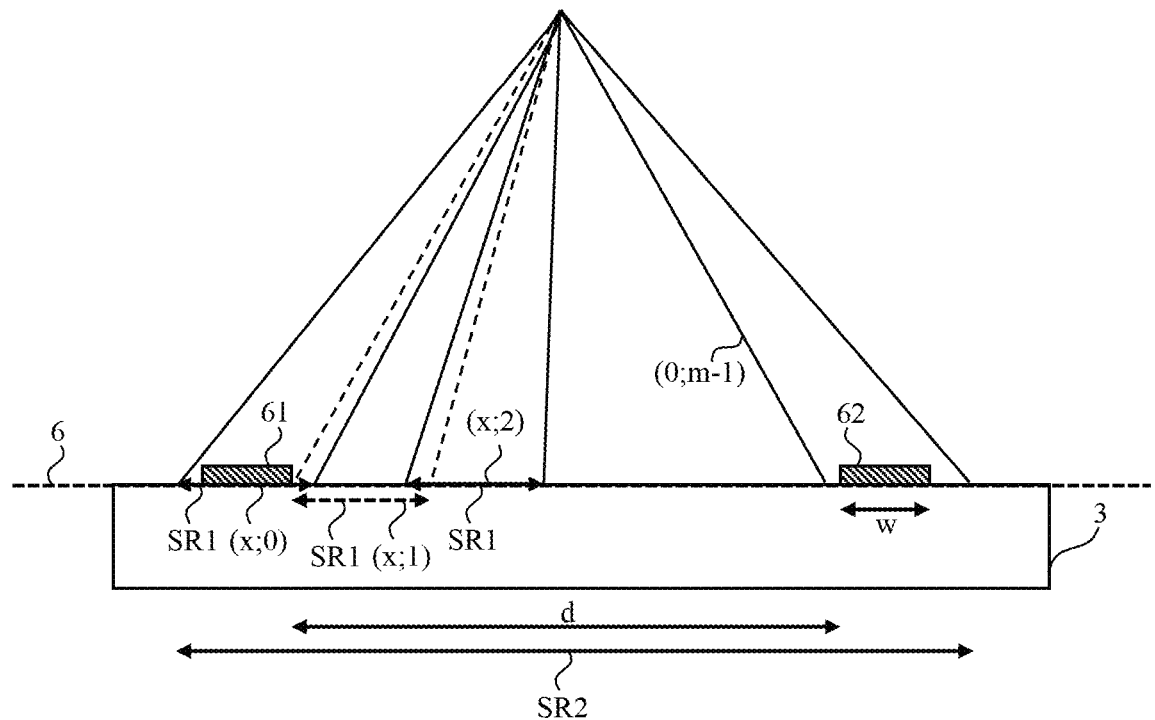
FIG. 4 schematically illustrates scanning ranges provided by the DAC circuits of the deflection subsystem.

Referring to FIG. 4, the contributions of the first analog output signal 40A1 and the second analog output signal 40A2 to the analog output signal 40A are related to their respective contributions to the deflecting of the charged particle beam 2. FIG. 4 illustrates the sample 3 having a plurality of regions of interest (ROIs) 61, 62. The ROIs 61, 62 are located on the surface of the sample 3. The surface of the sample 3 is located in the focal plane 6. The ROIs 61, 62 are remote, i.e., the ROIs 61, 62 are separated by a distance d which is large compared to a first scanning range SR1 provided by the first DAC circuit 41.

The first scanning range SR1 represents a length of a region in a focal plane 6 of the objective lens 12 scannable by varying the first digital deflection signal 40D1 while maintaining the second digital deflection signal 40D2. That is, the first scanning range SR1 represents the length of the region (in the focal plane 6 of the objective lens 12) onto which the charged particle beam 2 can be directed by deflecting the charged particle beam 2 by varying the first digital deflection signal 40D1 while not changing the second digital deflection signal 40D2.

Similarly, a second scanning range SR2 represents a length of a region in the focal plane 6 of the objective lens 12 scannable by varying the second digital deflection signal 40D2 while maintaining the first digital deflection signal 40D1. That is, the second scanning range SR2 represents the length of the region (in the focal plane 6 of the objective lens 12) onto which the charged particle beam 2 can be directed by deflecting the charged particle beam 2 by varying the second digital deflection signal 40D2 while not changing the first digital deflection signal 40D1.

A scanning region (x; 0) indicated by a double arrow in FIG. 4 is a region in the focal plane 6 of the objective lens 12. The first value in the brackets represents the specific value of the first digital deflection signal 40D1; and the second value in the brackets represents the specific value of the second digital deflection signal 40D2. The charged particle beam 2 can be directed to locations of the scanning region (x; 0) by varying the first digital deflection signal 40D1 (represented by the variable x ranging from 0 to n−1, where n is the bit depth of the first DAC circuit 41) while maintaining the second digital deflection signal 40D2 at a value of 0 (represented by the specific value 0). The length of the scanning region (x; 0) represents the first scanning range SR1 provided by the first DAC circuit 41 (for the specific value of the second digital deflection signal 40D2 of 0).

Similarly, a scanning region (x; 1) indicated by a double arrow in FIG. 4 is a region in the focal plane 6 of the objective lens 12. The charged particle beam 2 can be directed to locations of the scanning region (x; 1) by varying the first digital deflection signal 40D1 (represented by the variable x ranging from 0 to n−1, where n is the bit depth of the first DAC circuit 41) while maintaining the second digital deflection signal 40D2 at a value of 1 (represented by the specific value 1). The length of the scanning region (x; 1) represents the first scanning range SR1 provided by the first DAC circuit 41 (for the specific value of the second digital deflection signal 40D2 of 1).

Similarly, a scanning region (x; 2) indicated by a double arrow in FIG. 4 is a region in the focal plane 6 of the objective lens 12. The charged particle beam 2 can be directed to locations of the scanning region (x; 2) by varying the first digital deflection signal 40D1 (represented by the variable x ranging from 0 to n−1, where n is the bit depth of the first DAC circuit 41) while maintaining the second digital deflection signal 40D2 at a value of 2 (represented by the specific value 2). The length of the scanning region (x; 2) represents the first scanning range SR1 provided by the first DAC circuit 41 (for the specific value of the second digital deflection signal 40D2 of 2).

A charged particle beam trajectory indicated (0; m−1) is used to illustrate the scanning range SR2 provided by the second DAC circuit 42, where the specific value of the second digital deflection signal 40D2 of m−1 indicates the largest possible input value for the second digital deflection signal 40D2 based on a bit depth of m for the second DAC circuit 42.

Figure 5:
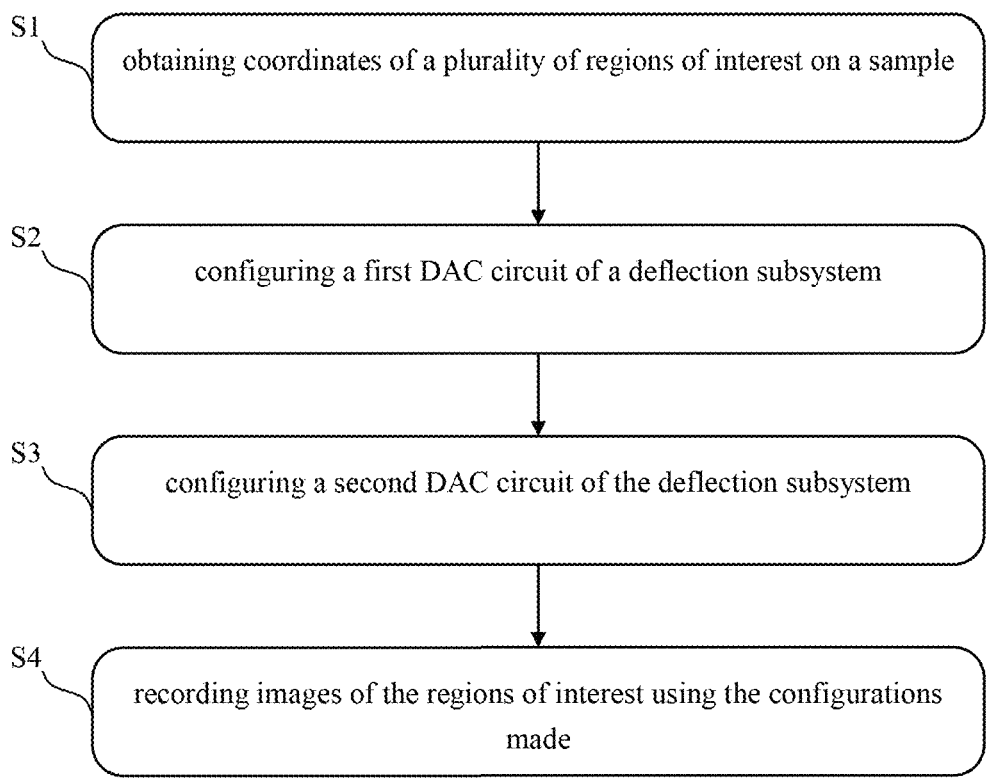
FIG. 5 is a flowchart illustrating an embodiment of the second aspect of the invention.

FIG. 5 illustrates a method according to an embodiment of the second aspect of the invention. The method relates to operating the above-described charged particle beam system 1. In particular, the method relates to advantageously configuring the deflection subsystem 40 for the sample 3 having remote ROIs 61, 62 as illustrated in FIG. 4.

In step S1, coordinates of the ROIs 61, 62 on the sample 3 are obtained. The coordinates can represent locations of boundaries of the ROIs 61, 62, thereby allowing determination of properties of the ROIs 61, 62 such as their sizes and shapes. Coordinate data representing the coordinates of the ROIs 61, 62 can be Obtained by the controller 20 of the charged particle beam system 1, for example, by data transfer from another device, by data transfer via a network such as the Internet, by reading from a data storage and the like. For this purpose, the charged particle beam system 1 can comprise a data interface for receiving the coordinate data and a data storage for storing the coordinate data, respectively.

The coordinates of the ROIs 61, 62 can be determined in the first place by any kind of method or instrument. For example, the coordinates of the ROIs 61, 62 can be obtained by light microscopy, dark field microscopy, charged particle beam microscopy, atomic force microcopy and the like. In particular, the coordinates of the ROIs 61, 62 can be obtained using the charged particle beam system 1. Further, the coordinates of the ROIs 61, 62 can be determined using design information of the sample 3 and the ROIs 61, 62. For example, in a preparation process, the sample 3 including the ROIs 61, 62 can be generated based on the design information. The design information can comprise information about the relative positions of the ROIs 61, 62, distances between the ROIs 61, 62 and the like. Still further, for example in chip production, the ROIs 61, 62 are located on a wafer (i.e. sample 3), and the wafer is prepared and transported by an automated system. Consequently, the orientation and location of the wafer is generally stored in a controller of the automated system, and the locations of the ROIs 61, 62 on the wafer are generally stored in design information. Therefore, the coordinates of the ROIs can be provided by the controller of the automated system.

In steps S2 and S3, the first DAC circuit 41 and the second DAC circuit 42 of the deflection subsystem 40 are configured based on the obtained coordinates of the ROIs 61, 62. In particular, in step S2, the first amplification of the first amplifier 46 is configured; and in step S3, the second amplification of the second amplifier 48 is configured. The controller 20 can be configured to determine distances between the ROIs 61, 62 and sizes, shapes and the like of the ROIs 61, 62 which are used for the configuring of the first DAC circuit 41 and the second DAC circuit 42. In particular, controller 20 can be configured to determine a setting of the first DAC circuit 41 (first amplification of the first amplifier 46) and a setting of the second DAC circuit 42 (second amplification of the second amplifier 48) based on obtained coordinates of the ROIs 61, 62 so that a predefined set of constraints is fulfilled.

For example, in accordance with the illustration of FIG. 4, the first DAC circuit 41, in particular the first amplification of the first amplifier 46, can be set (i.e., selected) so that the first scanning range SR1 is at least as large as the largest of the ROIs 61, 62. Consequently, each of the ROIs 61, 62 is scannable at high precision and high resolution, i.e. by varying the first digital deflection signal (40D1) while maintaining the second digital deflection signal (40D2). Further, the second DAC circuit 42, in particular the second amplification of the second amplifier 48, can be set (i.e., selected) so that the second scanning range SR2 is at least as large as the largest distance between the ROIs 61, 62. Consequently, all ROIs 61, 62 can be scanned without moving the stage 4. I.e., images of the ROIs 61, 62 can be recorded while maintaining the stage 4 in position.

Subsequently, in step S4, images of the ROIs 61, 62 are recorded using the configurations made. In particular, the charged particle beam 2 can be scanned over the ROIs 61, 62 and interaction products (e.g., backscattered or secondary electrons, backscattered or secondary ions, radiation, etc.) of the charged particle beam 2 with the sample 3 are detected in order to record the images. Using the configurations made above, an image of each of the ROIs 61, 62 can be recorded by scanning the charged particle beam 2 over the respective ROI by varying the first digital deflection signal 40D1 and maintaining the second digital deflection signal 40D2. example, referring to FIG. 4, an image of the ROI 61 can be recorded by varying the first digital deflection signal 40D1 from 0 to n−1 and maintaining the second digital deflection signal 40D2 at 0. For recording an image of the ROI 62, the second digital deflection signal 40D2 is varied to m−1 and maintained at m−1 while scanning the charged particle beam 2 over the ROI 62 by varying the first digital deflection signal 40D1.

Referring back to FIG. 2, the deflection subsystem 50 of the deflection system 13 is structured in the same manner as the deflection subsystem 40. However, the deflection subsystem 50 is provided to deflect the charged particle beam 2 in another deflection direction different from the deflection direction along which the charged particle beam 2 can be deflected by the deflection subsystem 40. Therefore, the deflection system 13 can be configured to deflect the charged particle beam 2 into multiple different deflection directions.

Despite having the same structure as the deflection system 40, the deflection subsystem 50 and its components can be configured and set independently from the deflection subsystem 40. The deflection subsystem 50 comprises a first DAC circuit 51 similar to the first DAC circuit 41, a second DAC circuit 52 similar to the second DAC circuit 42, a summer 53 similar to the summer 43, and a field generator 54 similar to the field generator 44. A more detailed description of the deflection subsystem 50 is omitted for brevity; reference is made to the corresponding deflection subsystem 40 and its components.

Figure 6:
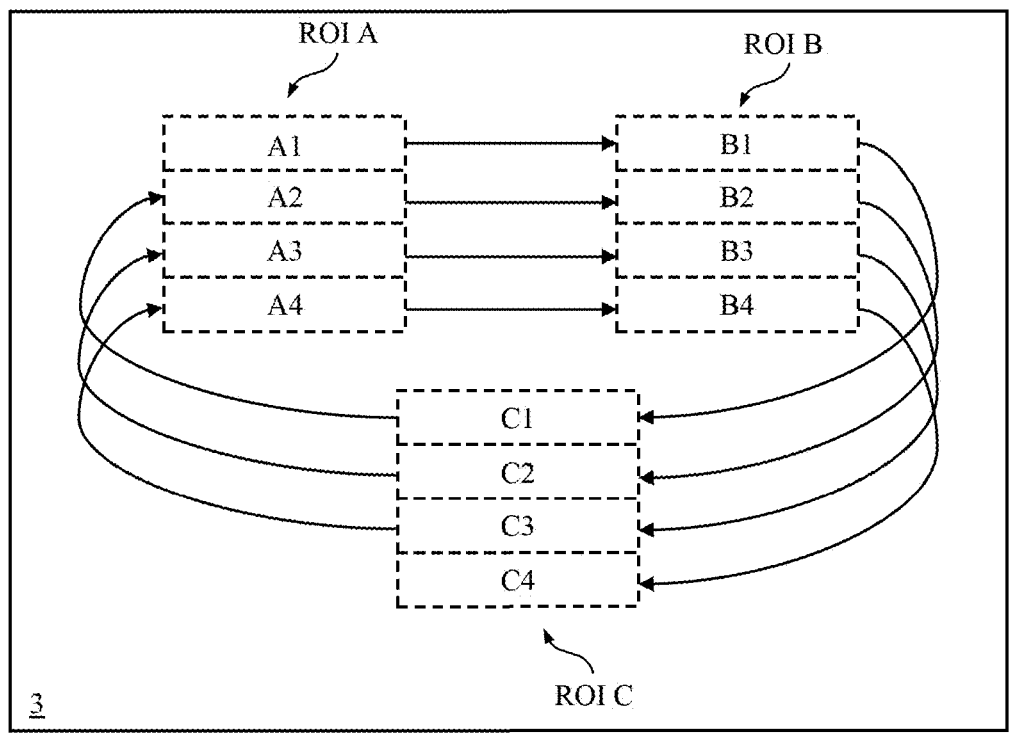
FIG. 6 illustrates scan regions on a sample and a scan order of scanning the scan regions according to an embodiment of the third aspect of the invention.

With reference to FIGS. 6 to 9, exemplary embodiments of a method according to the third aspect of the invention are described. The method comprises recording a plurality of images representing a plurality of different regions of interest (ROIs) A, B, C on a sample 3. FIG. 6 illustrates an example of the ROIs A, B, C on the sample 3.

The recording of the plurality of images of the ROIs A, B, C comprises scanning a charged particle beam 2 over a plurality of scan regions so that a set of predetermined constraints is fulfilled. FIG. 6 illustrates an example of the scan regions A1 to A4, B1 to B4, C1 to C4 on the sample 3 and a scan order of scanning the scan regions A1 to A4, B1 to B4, C1 to C4.

The scanning of the charged particle beam 2 over each of the scan regions A1 to A4, B1 to B4, C1 to C4 comprises directing the charged particle beam 2 to a plurality of different locations of the respective scan region; detecting, during the scanning of the charged particle beam over the respective scan region, interaction products of the charged particle beam 2 with the sample 3; and storing measurement data based on a detection rate of the detecting. Accordingly, a scan region is a region of the sample to which the charged particle beam 2 is directed for recording a portion of an image of a region of interest comprising the scan region.

The constraints comprise that each of the ROIs comprises a plurality of the scan regions. In the example illustrated in FIG. 6, the ROI A comprises four scan regions A1, A2, A3 and A4; the ROI B comprises four scan regions B1, B2, B3 and B4; and the ROI C comprises four scan regions C1 C2, C3 and C4. In general the number of scan regions per ROI can be different for each of the ROIs. In practice, the number of scan regions per ROI will be much greater than four. For example, each of the regions of interest can comprise at least 10 or at least 100 scan regions. That is, the number of scan regions per ROI can amount to at least 10 or at least 100.

For example, as illustrated in FIG. 6, the scan regions A1 to A4, B1 to B4, C1 to C4 can be line segments of the ROIs. However, any portion of a ROI can be selected as a scan region. A maximum distance between adjacent scan regions belonging to a same one of the regions of interest should amount to at most 200 nm or at most 100 nm or at most 50 nm or at most 20 nm or at most 10 nm. Otherwise, the image has poor resolution.

The constraints further comprise that each two scan regions to be scanned in succession are separated by at least a first minimum distance amounting to at least 100 nm. The expression "in succession" means directly one after the other in time without interruption by scanning of any other scan region. In other words, two scan regions to be scanned in succession are a scan region to be scanned and a scan region to be scanned directly thereafter (next). In FIG. 6, the order of the scanning of the scan regions A1 to A4, B1 to B4, C1 to C4 is illustrated by arrows connecting the scan regions A1 to A4, B1 to B4, C1 to C4. In particular, the order of the scanning of the scan regions A1 to A4, B1 to B4, C1 to C4 illustrated in the example of FIG. 6 is: A1, B1, C1, A2, B2, C2, A3, B3, C3, A4, B4, C4. All two scan regions to be scanned in succession are (A1, B1), (B1, C1), (C1, A2), (A2, B2), (B2, C2), (C2, A3), (A3, B3), (B3, C3), (C3, A4), (A4, B4), (B4, C4).

Figure 7:
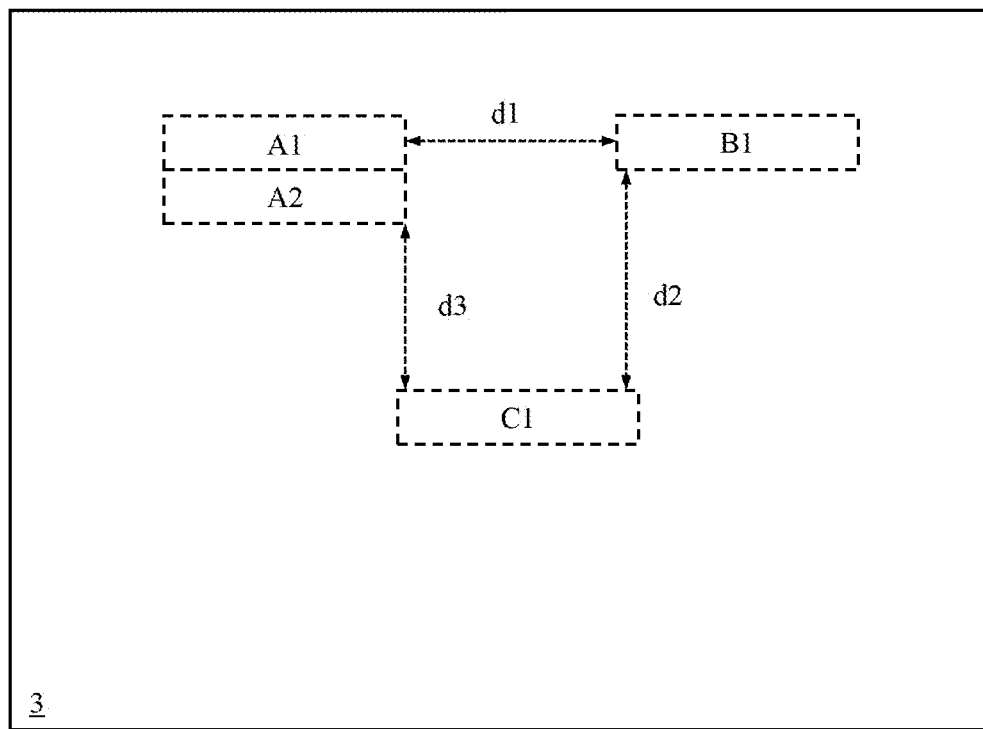
FIG. 7 illustrates details regarding the scan regions on the sample.

According to the constraint, each two scan regions to be scanned in succession are separated by at least the first minimum distance. In particular, this means each two scan regions to be scanned in succession are separated by a shortest distance to each other which amounts to at least the first minimum distance. As an illustrative example, FIG. 7 illustrates the shortest distances between the first few two scan regions to be scanned in succession: d1 denotes the shortest distance between the first two scan regions to be scanned in succession (A1, B1); d2 denotes the shortest distance between the second two scan regions to be scanned in succession (B1, C1); and d3 denotes the shortest distance between the third two scan regions to be scanned in succession (C1, A2). As the distance between each two scan regions to be scanned in succession is fairly large, charge accumulated at a scan region has little effect on the scanning of the charged particle beam over the scan region to be scanned next.

This effect can be improved by increasing the first minimum distance. For example, the first minimum distance can amount to at least 200 nm or at least 500 nm or at least 1000 nm.

The constraints further comprise that each two scan regions to be scanned in succession belong to different ones of the regions of interest. In the example illustrated in FIG. 6, the order of the ROIs associated with the order of the scanning of the scan regions is: A, B, C, A, B, C, A, B, C, A, B, C.

Figure 8:
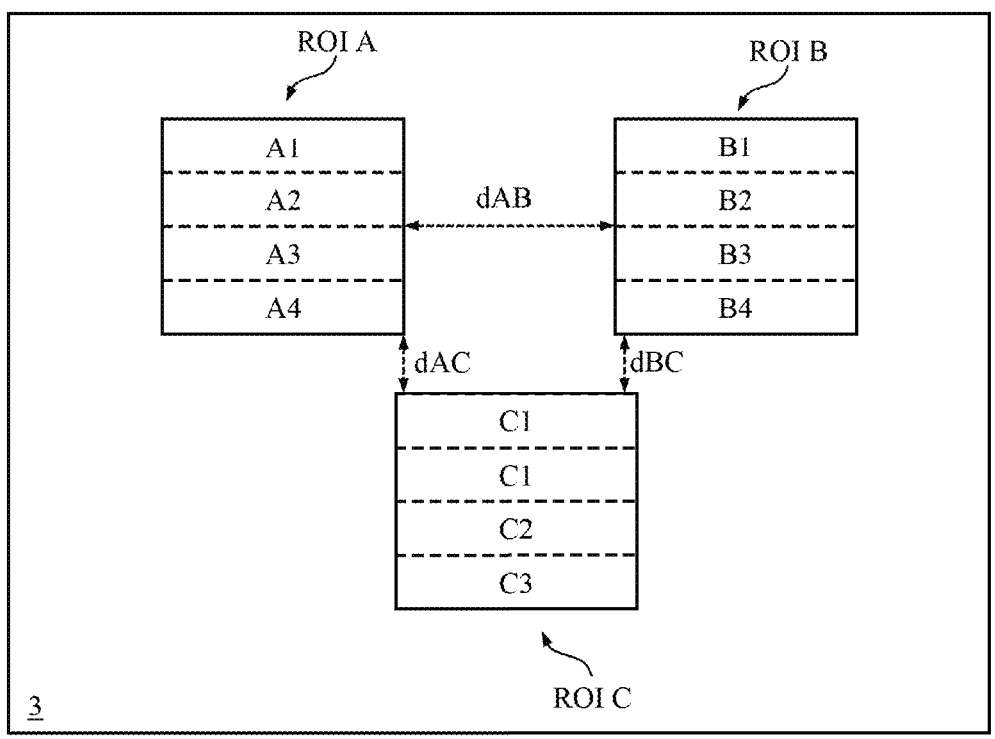
FIG. 8 illustrates details regarding the regions of interest on the sample.

FIG. 8 illustrates further details about the regions of interest. The ROIs A, B, C are not overlapping each other. That is, boundaries of the ROIs A, B, C illustrated as solid lines do not intersect each other. In particular, the ROIs can be separated by at least 10 nm or at least 50 nm or at least 100 nm or at least 500 nm or at least 1000 nm. That is, a shortest distance between adjacent ROIs can amount to at least 10 nm or at least 50 nm or at least 100 nm or at least 500 nm or at least 1000 nm. In FIG. 8, the shortest distance between the ROI A and the ROI B is denoted dAB; the shortest distance between the ROI B and the ROI C is denoted dBC; and the shortest distance between the ROI A and the ROI C is denoted dAC.

Further or alternatively, the ROIs can be separated by at least half of a size of a smallest one of the ROIs. That is, a shortest distance between boundaries of adjacent ROIs amounts to at least half of the size of the smallest one of the ROIs. The size of a ROI can be an average diameter of the ROI, for example.

The method has the effect that a plurality of images with reduced interference due to charge accumulation in the sample can be recorded using a charged particle beam. While the above example refers to three images and three ROIs A, B, C only, the method can be performed for two or more than three images and ROIs, respectively. While the above example refers to four scan regions per ROI only, the method can be performed using any number of at least two for the number of scan regions per ROI.

The recorded images can be displayed, for example, by the output device 33.

Figure 9:
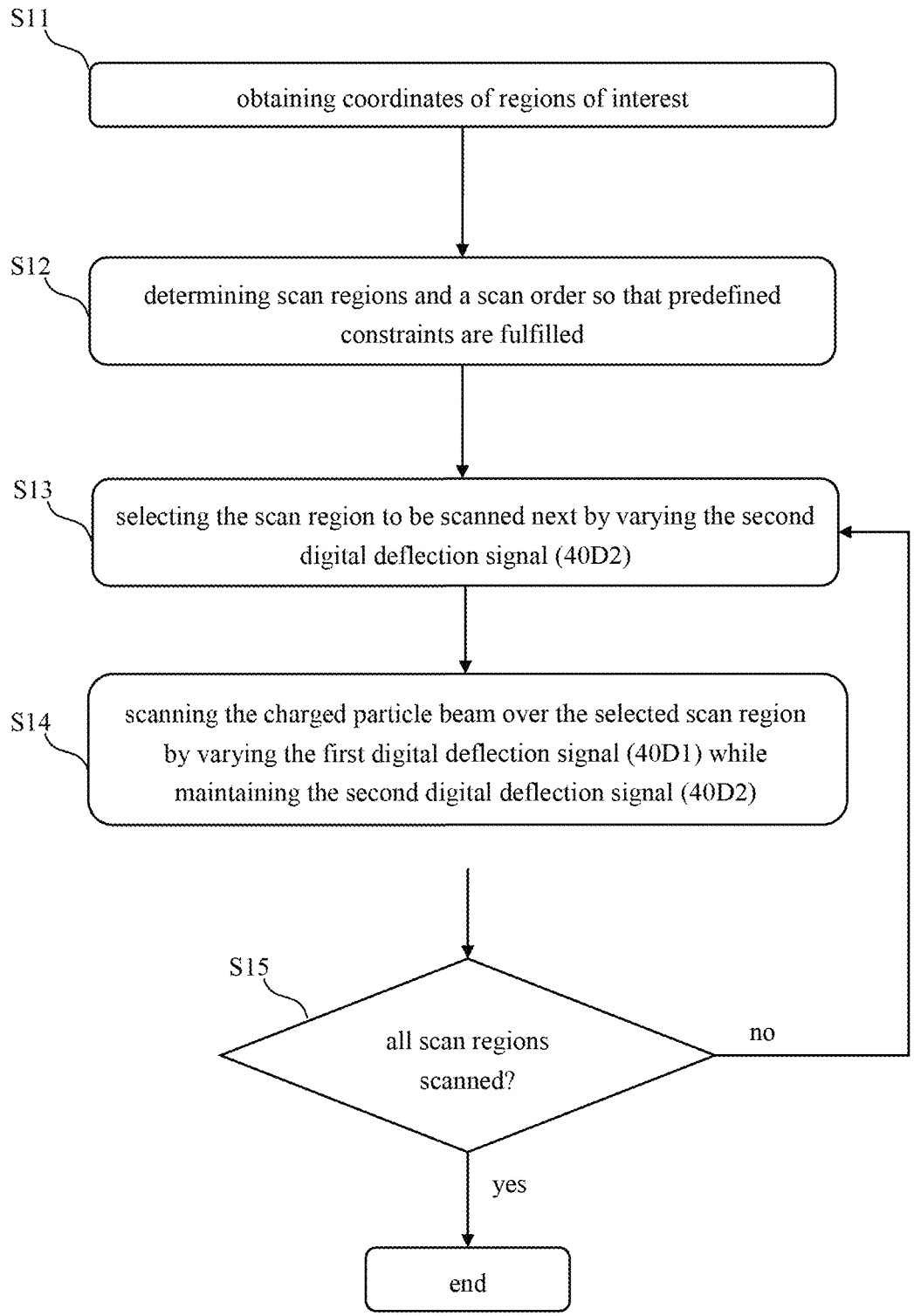
FIG. 9 is a flowchart illustrating another embodiment of the third aspect of the invention.

FIG. 9 is a flowchart illustrating another embodiment of the method according to the third aspect of the invention using the charged particle beam system 1 illustrated in FIG. 1 configured according to the method according to the second aspect of the present invention.

In step S11, coordinates of regions of interest A, B, C are obtained. This step corresponds to step S1 of the method illustrated in FIG. 5, the description of which is referred to.

Subsequent to step S11, in step S12, scan regions A1 to A4, B1 to B4, C1 to C4 and a scan order are determined based on the coordinates of the ROIs A, B, C obtained in step S11. The scan order defines an order of the scanning of the scan regions. The scan regions A1 to A4, B1 to B4, C1 to C4 and the scan order are determined so that the predetermined constraints are fulfilled. As described with reference to FIGS. 6 to 8, the constraints comprise: each of the ROIs A, B, C comprises a plurality of the scan regions A1 to A4, B1 to B4, C1 to C4; each two scan regions to be scanned in succession are separated by at least a first minimum distance amounting to at least 100 nm; and each two scan regions to be scanned in succession belong to different ones of the ROIs A, B, C.

Based on the coordinates of the ROIs A, B, C, the controller 20 of the charged particle beam system 1 or any other processor can be used to determine the scan regions and the scan order. The scan regions and the scan order can be determined prior to the scanning of the scan regions. Alternatively, the scan regions and the scan order can be determined in parallel to the scanning of the scan regions as required. A multiplicity of methods, algorithm and devices can be used to determine the scan regions and the scan order. However, for the method at hand, the particular implementation of the determining of the scan regions and the scan order is not relevant as long as the predefined constraints are fulfilled.

Subsequent to step S12, in step S13, a scan region to be scanned next is selected among the scan regions A1 to A4, B1 to B4, C1 to C4 in accordance with the scan order. The selecting of the scan region comprises varying the second digital deflection signal 40D2. The selecting of the scan region can further comprise varying the second digital deflection signal 50D2 of the deflection subsystem 50.

Subsequent to step S13, in step S14, the charged particle beam 2 is scanned over the selected scan region. The scanning of the charged particle beam 2 over the selected scan region comprises converting the first digital deflection signal 40D1 into the first analog output signal 40A1; converting the second digital deflection signal 40D2 into the second analog output signal 40A2; generating the analog deflection signal 40A based on the sum of the first analog output signal 40A1 and the second analog output signal 40A2; deflecting the charged particle beam 2 using the analog deflection signal 40A; and varying the first digital deflection signal 40D1 while maintaining the second digital deflection signal 40D2.

The scanning of the charged particle beam 2 over the selected scan region can further comprise converting the first digital deflection signal 50D1 into the first analog output signal 50A1; converting the second digital deflection signal 50D2 into the second analog output signal 50A2; generating the analog deflection signal 50A based on the sum of the first analog output signal 50A1 and the second analog output signal 50A2; deflecting the charged particle beam 2 using the analog deflection signal 50A, and varying the first digital deflection signal 50D1 while maintaining the second digital deflection signal 50D2.

Subsequent to step S14, in step S15, it is determined whether all of the scan regions A1 to A4, B1 to B4, C1 to C4 were scanned. If all of the scan regions A1 to A4, B1 to B4, C1 to C4 were scanned, the images of the regions of interest A, B, C are fully recorded and the method ends. If not all of the scan regions A1 to A4, B1 to B4, C1 to C4 were scanned, steps S13 to S15 are repeated, whereby another one of the scan regions A1 to A4, B1 to B4, C1 to C4 is scanned. Steps S13 to S15 are repeated until all of the scan regions A1 to A4, B1 to B4, C1 to C4 were scanned, that is, until all of the images of the s of interest A, B, C are fully recorded.

In some implementations, the processing unit 32 and the controller 20 can each include one or more data processors for processing data, one or more storage devices for storing data, and/or one or more computer programs including instructions that when executed by the processing unit 32 or the controller 20 cause the processing unit 32 or the controller 20 to carry out the processes described above.

In some implementations, the processing unit 32 and the controller 20 can each include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the processing unit 32 and the controller 20 can each be configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for operating the charged particle beam system described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and nonvolatile memory and/or storage elements), at least one wired or wireless input device or port, and at least one wired or wireless output device or port.

In some implementations, the software may be provided on a medium, such as a. CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many specific implementation details, these should not be construed as limitations on the scope of any inventions or of what may be claimed, but rather as descriptions of features specific to particular embodiments of particular inventions. Numerous variations and alternative embodiments will be apparent to a person skilled in the art, for example through combination and/or exchange of features of individual embodiments. Accordingly, such variations and alternative embodiments are concomitantly encompassed by the present invention, and the scope of the invention is restricted only within the meaning of the appended claims and the equivalents thereof.

Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Although the present invention is defined in the attached claims, it should be understood that the present invention can also be defined in accordance with the following embodiments:

Embodiment 1: A charged particle beam system (1), comprising:
- a charged particle beam source (11) configured to generate a charged particle beam (2);
- an objective lens (12) configured to focus the charged particle beam (2) into a focal plane (6);
- a deflection system (13) configured to deflect the charged particle beam (2), wherein the deflection system (13) comprises at least one deflection subsystem (40, 50), wherein each deflection subsystem (40, 50) comprises:
- a first DAC circuit (41) configured to convert a first digital deflection signal (40D1) into a first analog output signal (40A1) within a first operating range (OR1) at steps of a first step height (SH1),
- a second DAC circuit (42) configured to convert a second digital deflection signal (40D2) into a second analog output signal (40A2) within a second operating range (OR2) at steps of a second step height (SH2),
- a summer (43) configured to receive the first analog output signal (40A1) and the second analog output signal (40A2) and to output an analog deflection signal (40A) based on the sum of the received first analog output signal (40A1) and the received second analog output signal (40A2), and
- a field generator (44) configured to receive the analog deflection signal (40A) and to generate a magnetic and/or electric field for deflecting the charged particle beam (2) using the received analog deflection signal (40A);
- wherein the charged particle beam system (1) further comprises:
  - a controller (20) configured to generate the first digital deflection signal (40D1) and the second digital deflection signal (40D2) separately for each deflection subsystem (40, 50).

Embodiment 2: The charged particle beam system (1) according to embodiment 1,
wherein the first operating range (OR1) is approximately equal to the second step height (SH2).

Embodiment 3: The charged particle beam system (1) according to embodiment 1 or 2,
wherein a ratio of the second operating range (OR2) to the first operating range (OR1) amounts to at least 10, in particular at least 100, more in particular at least 200.

Embodiment 4: The charged particle beam system (1) according to any one of embodiments 1 to 3,
wherein an accuracy of converting the first digital deflection signal (40D1) into the first analog output signal (40A1) achieved by the first DAC circuit (41) is greater than an accuracy of converting the second digital deflection signal (40D2) into the second analog output signal (40A2) achieved by the second DAC circuit (42).

Embodiment 5: The charged particle beam system (1) according to any one of embodiments 1 to 4,
wherein the first DAC circuit (41) comprises a first DAC (45) configured to convert the first digital deflection signal (40D1) into a first analog intermediate signal (40I1) and a first amplifier (46) configured to generate the first analog output signal (40A1) by amplifying the first analog intermediate signal (40I1) with a first amplification;
wherein the second DAC circuit (42) comprises a second DAC (47) configured to convert the second digital deflection signal (40D2) into a second analog intermediate signal (40I2) and a second amplifier (48) configured to generate the second analog output signal (40A2) by amplifying the second analog intermediate signal (40I2) with a second amplification.

Embodiment 6. The charged particle beam system (1) according to embodiment 5,
wherein the first amplification defines the first step height (SH1),
wherein the second amplification defines the second step height (SH2),
wherein a bit depth of the first DAC (45) and the first amplification define the first operating range (OR1),
wherein a bit depth of the second DAC (47) and the second amplification define the second operating range (OR2).

Embodiment 7: The charged particle beam system (1) according to embodiment 5 or 6,
wherein the first amplification and the second amplification are selected so that the first operating range (OR1) is approximately equal to the second step height (SH2).

Embodiment 8: The charged particle beam system (1) according to any one of embodiments 5 to 7,
wherein the first amplification and the second amplification are selected so that a ratio of the second operating range (OR2) to the first operating range (OR1) amounts to at least 10, in particular at least 100, more in particular at least 200.

Embodiment 9: The charged particle beam system (1) according to any one of embodiments 5 to 8.
wherein an accuracy of converting the first digital deflection signal (40D1) into the first analog intermediate signal (40I1) achieved by the first DAC (45) is greater than an accuracy of converting the second digital deflection signal (40D2) into the second analog intermediate signal (40I2) achieved by the second DAC (47).

Embodiment 10: The charged particle beam system) according to any one of embodiments 5 to 9,
wherein a bit depth of the first DAC (45) is greater than a bit depth of the second DAC (47).

Embodiment 11: The charged particle beam system (1) according to any one of embodiments 1 to 10,
wherein the deflection system (13) is configured to deflect the charged particle beam (2) so that the charged particle beam (2) can be directed to a plurality of different locations in the focal plane (6).

Embodiment 12: A method of operating the charged particle beam system (1) according to any one of embodiments 1 to 11, the method comprising:
- obtaining coordinates of a plurality of regions of interest (61, 62) on a sample (3);
- configuring the first DAC circuit (41) so that a first scanning range (SR1) provided by the first DAC circuit (41) is at least as large as the largest of the regions of interest (61, 62), the first scanning range (SR1) representing a length of a region in the focal plane (6) of the objective lens (12) scannable by varying the first digital deflection signal (40D1) while maintaining the second digital deflection signal (40D2);

configuring the second DAC circuit (42) so that a second scanning range (SR2) provided by the second DAC circuit (42) is at least as large as the largest distance (d) between the regions of interest (61, 62), the second scanning range (SR2) representing a length of a region in the focal plane (6) of the objective lens (12) scannable by varying the second digital deflection signal (40D2) while maintaining the first digital deflection signal (40D1); and recording images of the regions of interest (61, 62) using the configurations made.

Embodiment. 13: The method according to embodiment 12, wherein the recording of each of the images comprises:
scanning the charged particle beam (2) over the region of interest associated with the respective image by varying the first digital deflection signal (40D1) and maintaining the second digital deflection signal (40D2), and
detecting an interaction product of the charged particle beam (2) with the sample (3) during the scanning.

Embodiment 14: The method according to embodiment 12 or 13, wherein the recording of the images further comprises:
selecting a next one of the regions of interest by varying the second digital deflection signal (40D2).

Embodiment 15: The method according to any one of embodiments 12 to 14, wherein the recording of the images further comprises:
maintaining a stage (4) in position, the stage (4) holding the sample (3).

Embodiment 16: The method according to any one of embodiments 12 to 15 of operating the charged particle beam system (1) according to any one of embodiments 5 to 10, wherein the configuring of the first DAC circuit (41) comprises setting the first amplification; and the configuring of the second DAC (42) circuit comprises setting the second amplification.

Embodiment 17: A computer program comprising instructions which, when executed by a controller of a charged particle beam system (1) according to any one of embodiments 1 to 11, enable the charged particle beam system (1) to execute the method according to any one of embodiments 12 to 16.

Embodiment 18: A method of recording a plurality of images representing different regions of interest of a sample, the method comprising:
recording a plurality of images representing a plurality of different regions of interest (A, B, C) on a sample (3), comprising:
scanning a charged particle beam (2) over a plurality of scan regions (A1 to A4, B1 to B4, C1 to C4),
wherein each of the regions of interest (A, B; C) comprises a plurality of the scan regions (A1 to A4, B1 to 134. C1 to C4),
wherein each two scan regions to be scanned in succession are separated by at least a first minimum distance amounting to at least 100 nm, and
wherein each two scan regions to be scanned in succession belong to different ones of the regions of interest (A, B, C).

Embodiment 19: The method according to embodiment 18, further comprising:
determining the plurality of scan regions (A1 to A4, B1 to B4, C1 to C4) and a scan order based on coordinates of the plurality of regions of interest (A, B, C), wherein the scan order defines an order of the scanning of the scan regions (A1 to A4, B1 to B4, C1 to C4).

Embodiment 20: The method according to embodiment 18 or 19, wherein the scanning of the charged particle beam (2) over each of the scan regions (A1 to A4, B1 to B4, C1 to C4) comprises:
converting a first digital deflection signal (40D1) into a first analog output signal (40A1);
converting a second digital deflection signal (40D2) into a second analog output signal (40A2);
generating an analog deflection signal (40A) based on the sum of the first analog output signal (40A1) and the second analog output signal (40A2); and.
deflecting the charged particle beam (2) using the analog deflection signal (40A).

Embodiment 21: The method according to embodiment 20, wherein the scanning of the charged particle beam (2) over each of the scan regions (A1 to A4, B1 to B4, C1 to C4) further comprises:
varying the first digital deflection signal (40D1) while maintaining the second digital deflection signal (40D2).

Embodiment 22: The method according to embodiment 20 or 21, wherein the recording of the plurality of images further comprises:
selecting, among the scan regions (A1 to A4, B1 to B4, C1 to C4), the scan region to be scanned next by varying the second digital deflection signal (40D2).

Embodiment 23: The method according any one of embodiments to 18 to 22, wherein the first minimum distance amounts at least 200 nm or at least 500 nm or at least 1000 nm.

Embodiment 24: The method according to any one of embodiments 18 to 23, wherein the scan regions (A1 to A4, B1 to B4, C1 to C4) are line segments of the regions of interest (A, B, C).

Embodiment 25: The method according to any one of embodiments 18 to 24, wherein a maximum distance between adjacent scan regions belonging to a same one of the regions of interest (A, B, C) amounts to at most 200 nm or at most 100 nm or at most nm or at most 20 nm or at most 10 nm.

Embodiment 26: The method according to any one of embodiments 18 to 25, wherein the regions of interest (A, B, C) are not overlapping each other.

Embodiment 27: The method according to any one of embodiments 18 to 26, wherein the regions of interest (A, B, C) are separated by at least 10 nm or at least 50 nm or at least 100 nm or at least 500 nm or at least 1000 nm.

Embodiment 28: The method according to any one of embodiments 18 to 27, wherein the regions of interest (A, B, C) are separated by at least half of a size of a smallest one of the regions of interest (A, B, C).

Embodiment 29: The method according to any one of embodiments 18 to 28, wherein the recording of the plurality of images further comprises:
detecting, during the scanning of the charged particle beam (2) over the scan regions (A1 to A4, B1 to B4, C1 to C4), interaction products of the charged particle beam (2) with the sample (3); and
storing measurement data based on a detection rate of the detecting of the interaction products of the charged particle beam (2) with the sample (3).

Embodiment 30: The method according to any one of embodiments 18 to 29, wherein each of the regions of interest (A, B, C) comprises at least 10 or at least 100 of the scan regions (A1 to A4, B1 to B4, C1 to C4).

Embodiment 31: The method according to any one of embodiments 18 to 30, further comprising:
displaying the images.

Embodiment 32: The method according to any one of embodiments 18 to 31, wherein the method is performed using the charged particle beam system (1) according to any one of embodiments 1 to 11.

Embodiment 33: A computer program comprising instructions which, when executed by a controller of a charged particle beam system, in particular the controller (20) of the charged particle beam system (1) according to any one of embodiments 1 to 11, enable the charged particle beam system to execute the method according to any one of embodiments 18 to 32.

What is claimed is:

1. A method of recording a plurality of images representing different regions of interest of a sample, the method comprising:
   recording a plurality of images representing a plurality of different regions of interest on a sample, comprising:
      scanning a charged particle beam over a plurality of scan regions including at least four scan regions,
      wherein each of the regions of interest comprises a plurality of the scan regions,
      wherein each two scan regions to be scanned in succession are separated by at least a first minimum distance amounting to at least 100 nm, and
      wherein each two scan regions to be scanned in succession belong to different ones of the regions of interest.

2. The method of claim 1, further comprising:
   determining the plurality of scan regions and a scan order based on coordinates of the plurality of regions of interest,
   wherein the scan order defines an order of the scanning of the scan regions.

3. The method of claim 1, wherein the scanning of the charged particle beam over each of the scan regions comprises:
   converting a first digital deflection signal into a first analog output signal;
   converting a second digital deflection signal into a second analog output signal;
   generating an analog deflection signal based on the sum of the first analog output signal and the second analog output signal; and
   deflecting the charged particle beam using the analog deflection signal.

4. The method of claim 3, wherein the scanning of the charged particle beam over each of the scan regions further comprises:
   varying the first digital deflection signal while maintaining the second digital deflection signal.

5. The method of claim 3, wherein the recording of the plurality of images further comprises:
   selecting, among the scan regions, the scan region to be scanned next by varying the second digital deflection signal.

6. The method of claim 1, wherein the first minimum distance amounts to at least 200 nm or at least 500 nm or at least 1000 nm.

7. The method of claim 1, wherein the scan regions are line segments of the regions of interest.

8. The method of claim 1, wherein a maximum distance between adjacent scan regions belonging to a same one of the regions of interest amounts to at most 200 nm or at most 100 nm or at most 50 nm or at most 20 nm or at most 10 nm.

9. The method of claim 1, wherein the regions of interest are not overlapping each other.

10. The method of claim 1, wherein the regions of interest are separated by at least 10 nm or at least 50 nm or at least 100 nm or at least 500 nm or at least 1000 nm.

11. The method of claim 1, wherein the regions of interest are separated by at least half of a size of a smallest one of the regions of interest.

12. The method of claim 1, wherein the recording of the plurality of images further comprises:
   detecting, during the scanning of the charged particle beam over the scan regions, interaction products of the charged particle beam with the sample; and
   storing measurement data based on a detection rate of the detecting of the interaction products of the charged particle beam with the sample.

13. The method of claim 1, wherein each of the regions of interest comprises at least 10 or at least 100 of the scan regions.

14. The method of claim 1, further comprising:
   displaying the images.

15. The method of claim 1, wherein the method is performed using a charged particle beam system.

16. A computer program comprising instructions which, when executed by a controller of a charged particle beam system enable the charged particle beam system to execute the method of claim 1.

17. The method of claim 2, wherein the scanning of the charged particle beam over each of the scan regions comprises:
   converting a first digital deflection signal into a first analog output signal;
   converting a second digital deflection signal into a second analog output signal;
   generating an analog deflection signal based on the sum of the first analog output signal and the second analog output signal; and
   deflecting the charged particle beam using the analog deflection signal.

18. The method of claim 2, wherein the first minimum distance amounts at least 200 nm.

19. The method of claim 2, wherein the scan regions are line segments of the regions of interest.

20. The method of claim 2, wherein a maximum distance between adjacent scan regions belonging to a same one of the regions of interest amounts to at most 200 nm.

21. The method of claim 1, wherein scanning a charged particle beam over a plurality of scan regions including at least four scan regions comprises scanning a first scan region in a first region of interest, scanning a second scan region in a second region of interest, then after scanning the second scan region, scanning a third scan region in the first region of interest.

* * * * *

UNITED STATES PATENT AND TRADEMARK OFFICE
CERTIFICATE OF CORRECTION

| | |
|---|---|
| PATENT NO. | : 12,293,895 B2 |
| APPLICATION NO. | : 18/379400 |
| DATED | : May 6, 2025 |
| INVENTOR(S) | : Eugen Foca et al. |

Page 1 of 2

It is certified that error appears in the above-identified patent and that said Letters Patent is hereby corrected as shown below:

In the Specification

Column 2
Line 41, after "based" delete "ci"
Line 43, delete "signal;" and insert -- signal, --

Column 5
Line 14, delete "by," and insert -- by --
Line 22, after "controller" insert -- 20 --
Line 39, after "beam" insert -- 2 --
Line 67, after "second analog output signal" insert -- 40A2 --

Column 6
Line 3, after "second analog output signals" insert -- 40A2 --
Line 19, after "first analog output signal" insert -- 40A1 --
Line 56, delete "DAC:" and insert -- DAC --

Column 7
Line 4, delete "DAC has" and insert -- DAC 45) has --
Line 5, delete "second." and insert -- second --
Line 15, delete "second. DAC" and insert -- second DAC --
Line 19, delete "first. DAC circuit 41 (the first. DAC 45)" and insert -- first DAC circuit 41 (the first DAC 45) --
Line 20, after "of" insert -- 12; --
Line 30, delete "DAC:" and insert -- DAC --
Line 49, after "first analog output signal" insert -- 40A1 --
Line 59, after "second operating range" insert -- OR2 --

Signed and Sealed this
Fifth Day of August, 2025

Coke Morgan Stewart
*Acting Director of the United States Patent and Trademark Office*

CERTIFICATE OF CORRECTION (continued)
U.S. Pat. No. 12,293,895 B2

Column 8
Line 26, delete "DAC:" and insert -- DAC --
Line 31, delete "4011" and insert -- 40I1 --
Line 34, delete "4011" and insert -- 40I1 --
Line 42, delete "4012" and insert -- 40I2 --

Column 9
Line 33, delete "second. DAC" and insert -- second DAC --

Column 10
Line 60, delete "Obtained" and insert -- obtained --

Column 11
Line 5, delete "microcopy" and insert -- microscopy --
Line 65, before "example" insert -- For --

Column 12
Line 56, delete "C1 C2" and insert -- C1, C2 --

Column 15
Line 9, delete "50A," and insert -- 50A; --

Column 16
Line 23, delete "nonvolatile" and insert -- non-volatile --
Line 27, delete "such as a." and insert -- such as a --

Column 17
Line 56, delete "3." and insert -- 3, --

Column 18
Line 4, delete "(4011)" and insert -- (40I1) --
Line 37, delete "8." and insert -- 8, --
Line 45, delete "charged particle beam system)" and insert -- charged particle beam system (1) --

Column 19
Line 12, delete "Embodiment. 13" and insert -- Embodiment 13 --
Line 52, delete "A, B; C" and insert -- A, B, C --
Line 54, delete "134." and insert -- B4, --

Column 20
Line 11, delete "and." and insert -- and --
Line 26, after "according" insert -- to --
Line 27, after "embodiments" delete "to"
Line 38, delete "at most nm" and insert -- at most 50 nm --